United States Patent
Shrader

(10) Patent No.: US 8,627,169 B2
(45) Date of Patent: Jan. 7, 2014

(54) METHOD AND APPARATUS FOR DYNAMICALLY CONFIGURABLE MULTI LEVEL ERROR CORRECTION

(75) Inventor: Steven Shrader, Meridian, ID (US)

(73) Assignee: Cadence Design Systems, Inc., San Jose, CA (US)

( * ) Notice: Subject to any disclaimer, the term of this patent is extended or adjusted under 35 U.S.C. 154(b) by 1109 days.

(21) Appl. No.: 12/143,274

(22) Filed: Jun. 20, 2008

(65) Prior Publication Data

US 2009/0319864 A1    Dec. 24, 2009

(51) Int. Cl.
*H03M 13/00* (2006.01)

(52) U.S. Cl.
USPC ......................................................... 714/758

(58) Field of Classification Search
USPC ......................................................... 714/758
See application file for complete search history.

(56) References Cited

U.S. PATENT DOCUMENTS

| | | | |
|---|---|---|---|
| 7,162,677 B1 * | 1/2007 | Laumen et al. | 714/758 |
| 7,975,200 B2 * | 7/2011 | Mead | 714/752 |
| 2004/0123225 A1 * | 6/2004 | Cameron | 714/781 |
| 2004/0181735 A1 * | 9/2004 | Xin | 714/758 |
| 2007/0038915 A1 * | 2/2007 | Alaimo et al. | 714/758 |
| 2008/0034270 A1 * | 2/2008 | Onishi et al. | 714/758 |
| 2008/0072120 A1 * | 3/2008 | Radke | 714/768 |
| 2008/0229147 A1 * | 9/2008 | Earhart et al. | 714/15 |
| 2008/0270961 A1 * | 10/2008 | Mead | 716/6 |
| 2009/0125790 A1 * | 5/2009 | Iyer et al. | 714/773 |
| 2009/0213645 A1 * | 8/2009 | Parkinson et al. | 365/163 |

OTHER PUBLICATIONS

Stephen B. Wicker, "Error Control Systems" Prentice Hall (pp. 437-440) Publication Date: Jul. 29, 1994.*

* cited by examiner

*Primary Examiner* — Michael Maskulinski
*Assistant Examiner* — Neil Miles
(74) *Attorney, Agent, or Firm* — Sawyer Law Group, P.C.

(57) ABSTRACT

An invention is provided for dynamically configurable error correction. The invention includes receiving a check code configuration signal, which indicates a particular level of error detection. A check code generator is configured to generate check codes based on the particular level of error detection indicated by the check code configuration signal. In addition, an error locator configuration signal is received that indicates a particular level of error addressing, and an error locator is configured to produce addresses of errors in a set of data based on the particular level of error addressing indicated by the error locator configuration signal.

14 Claims, 5 Drawing Sheets

METHOD AND APPARATUS FOR DYNAMICALLY CONFIGURABLE MULTI LEVEL ERROR CORRECTION

BACKGROUND OF THE INVENTION

1. Field of the Invention

This invention relates generally to error correction, and more particularly to providing dynamically configurable multi level error correction hardware.

2. Description of the Related Art

As use of electronic data continues to increase, so do requirements for data storage reliability. Memory devices often experience a physical change that results in changes in its logical binary state, leading to erroneous data values being stored. To protect against such occurrences, electronic data systems typically incorporate error detection and correction schemes. In some schemes, the presence of an error can be detected, but not rectified, while other schemes allow for the automatic correction of certain errors. These schemes are often referred to as Error Correcting Codes (ECC).

ECC is common in data storage, such as magnetic disk storage, magnetic tape storage, and other non-volatile memory storage that stores data when power is disconnected from the system, such as Phase-change memory (PCM) or Flash memory. For example, when using a non-volatile memory such as Flash memory, ECC data often is stored in the memory along with the actual user data.

FIG. 1 is an illustration showing a typical prior art non-volatile memory arrangement 100 utilizing ECC data for data reliability checking. As illustrated in FIG. 1, a non-volatile memory 100 generally comprises a plurality of memory blocks 102, which generally is the smallest portion of memory that can be erased. Each memory block 102 generally comprises a fixed plurality of pages 104, which is the smallest size element that can be written or read from the non-volatile memory 100. Each page 104 typically is logically divided into two areas: a main area 106 and a spare area 108. It is in the spare area 108 where typical non-volatile memory systems store ECC data, such as the ECC check bits 110 illustrated in FIG. 1.

In general, prior art data storage devices, such as the non-volatile memory device illustrated in FIG. 1, are designed to use a fixed level of error correction and detection. For example, based on the reliability of the particular storage device and the desired level of data reliability needed, a fixed level of error correction and detection is used. Generally, higher levels of error correction and detection require more error detection data to be stored. For example, in FIG. 1, the higher the level of error correction and detection utilized, the more ECC check bits 110 are needed. This number is then set and fixed into the system design.

However, instances occur wherein the actual memory hardware may change, for example, when a Flash device is dynamically removed or added to a system. In such cases, the level of level of error correction and detection needed may change. For example, if more reliable memory is added to the system, the level of error correction and detection will be lower. Conversely, if less reliable memory is added to the system, the level of error correction and detection will be higher. Moreover, different hardware may have the ability to store less ECC data than is currently being utilized by the system. In such cases, it can be difficult or impossible to continue with the same level of error correction and detection because the required storage space for the ECC data may not be available. Unfortunately, conventional systems are unable to accommodate these circumstances because the level of error correction and detection is fixed when the system is designed.

In view of the foregoing, there is a need for systems and methods that have the ability to accommodate varying levels of error correction and detection dynamically during system operation. Moreover, to avoid wasted space and costs, such systems and methods should not require extra hardware that is never utilized in the system.

SUMMARY OF THE INVENTION

Broadly speaking, the present invention addresses these needs by providing dynamically configurable multi level error correction. Embodiments of the present invention allow the level of error detection to be dynamically configured via a signal to check code generation hardware. Similarly, the level of error correction is configured utilizing a signal to error location hardware. As a result, the level of error detection and correction can be changed dynamically during system operation to accommodate changing hardware requirements.

For example, in one embodiment a method for providing dynamically configurable error correction is disclosed. The method includes receiving a check code configuration signal, which indicates a particular level of error detection. Then, a check code generator is configured to generate check codes based on the particular level of error detection indicated by the check code configuration signal. In addition, an error locator configuration signal is received that indicates a particular level of error addressing, and an error locator is configured to produce addresses of errors in a set of data based on the particular level of error addressing indicated by the error locator configuration signal. For example, the check code configuration signal can indicate a number of bits having errors that can be detected in data, and the check code generator can be configured to generate an amount of ECC data based on the level of error detection indicated by the check code configuration signal. Similarly, the error locator configuration signal can indicate a number of addresses of bits having errors in the data that can be calculated by the error locator.

A non-volatile memory controller having dynamically configurable multi level error correction is disclosed in an additional embodiment of the present invention. The non-volatile memory controller includes a check code configuration signal indicating a particular level of error detection. A check code generator is coupled to the check code configuration signal and is configured to generate an amount of ECC data based the particular level of error detection indicated by the check code configuration signal. The non-volatile memory controller also includes an error locator configuration signal indicating a particular level of error addressing. Coupled to the error locator configuration signal is an error locator, which is configured to calculate addresses of errors in a set of data based on the particular level of error addressing indicated by the error locator configuration signal. For example, the check code generator can be a read check code generator that calculates a syndrome polynomial based on read data received and the level or error detection indicated by the check code configuration signal. In this case, the error locator configuration signal can indicate a number of addresses of bits having errors in the data that can be calculated by the error locator. Further, the error locator can, for example, calculate a number of roots to the syndrome polynomial based on the level of error addressing indicated by the error locator configuration signal.

In further method for providing dynamically configurable error correction is disclosed in an additional embodiment of the present invention. The method includes receiving a check code configuration signal that indicates a number of bits having errors that can be detected in data. Based on the value of the check code configuration signal, the check code generator is configured to generate a particular level of check codes. In addition, an error locator configuration signal is received that indicates a number of addresses of bits having errors in the data that can be calculated by the error locator. The method further includes configuring an error locator to produce addresses of errors in a set of data based on the value of the error locator configuration signal. To do this, the error locator is configured to utilize a particular amount of existing error locator hardware based on the level of error addressing indicated by the error locator configuration signal. Hence, using this approach, the error locator can utilize less error locator hardware than the total error locator hardware available when the level of error addressing indicated by the error locator configuration signal is less than a maximum level of error addressing supported by the system.

In this manner, embodiments of the present invention advantageously allow the level of error detection and correction to be dynamically configured via signals to check code generation hardware and error location hardware. Thus, the level of error detection and correction can be changed dynamically during system operation to accommodate changing hardware requirements. Moreover, an error detection guard band can be configured so as to be able to, for example, detect larger errors than can be corrected by setting the level of error detection and error correction different from one another. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for dynamically configurable multi level error correction hardware. Broadly speaking, embodiments of the present invention allow the level of error detection to be dynamically configured via a signal to check code generation hardware. Similarly, the level of error correction is configured utilizing a signal to error location hardware. In this manner, the level of error detection and correction can be changed dynamically during system operation to accommodate changing hardware requirements. Moreover, the level of error detection and error correction can be set different from one another. Thus, an error detection guard band can be configured so as to be able to, for example, detect larger errors than can be corrected.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
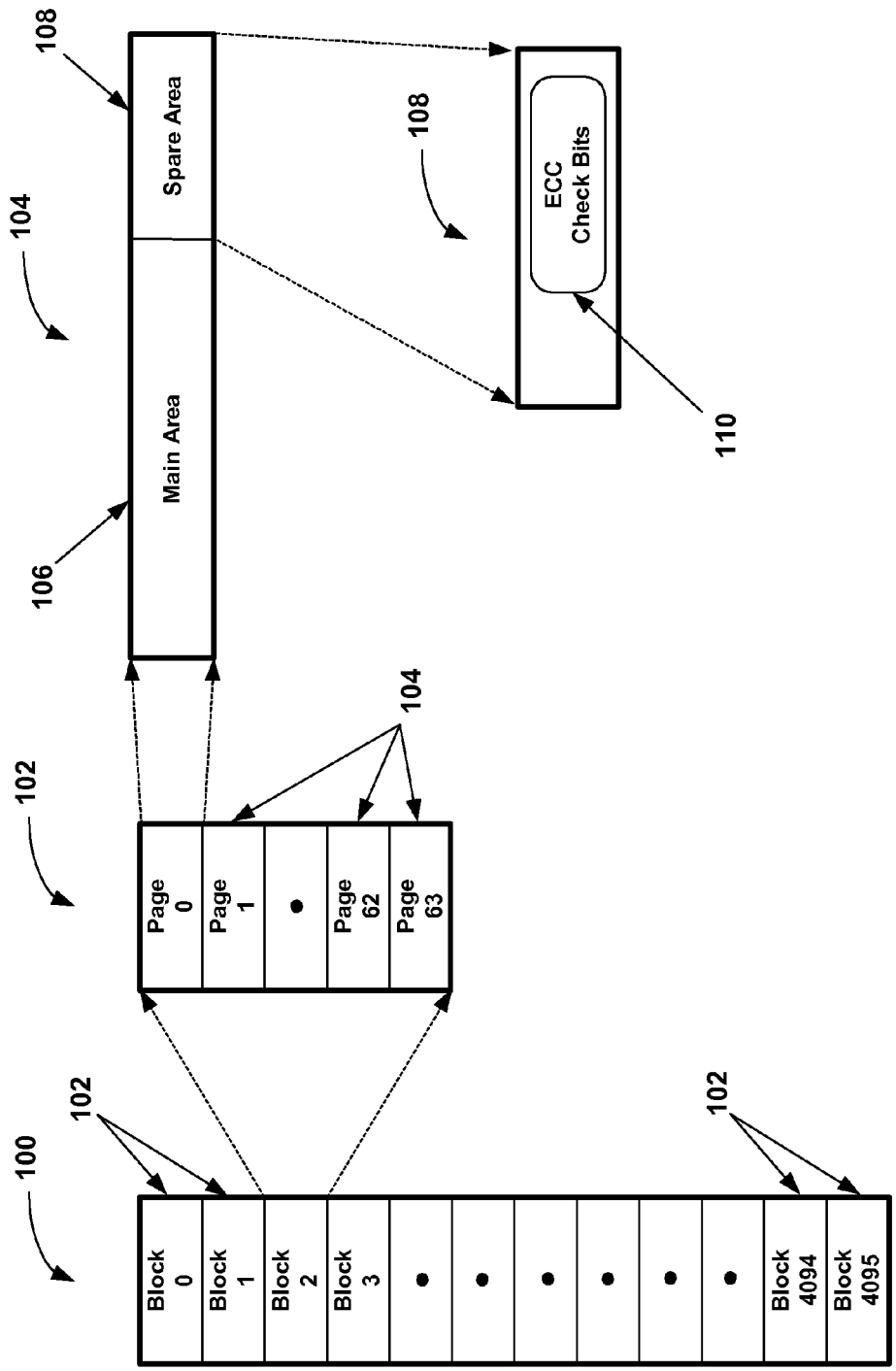
FIG. 1 is an illustration showing a typical prior art non-volatile memory arrangement utilizing ECC data for data reliability checking.
Figure 2:
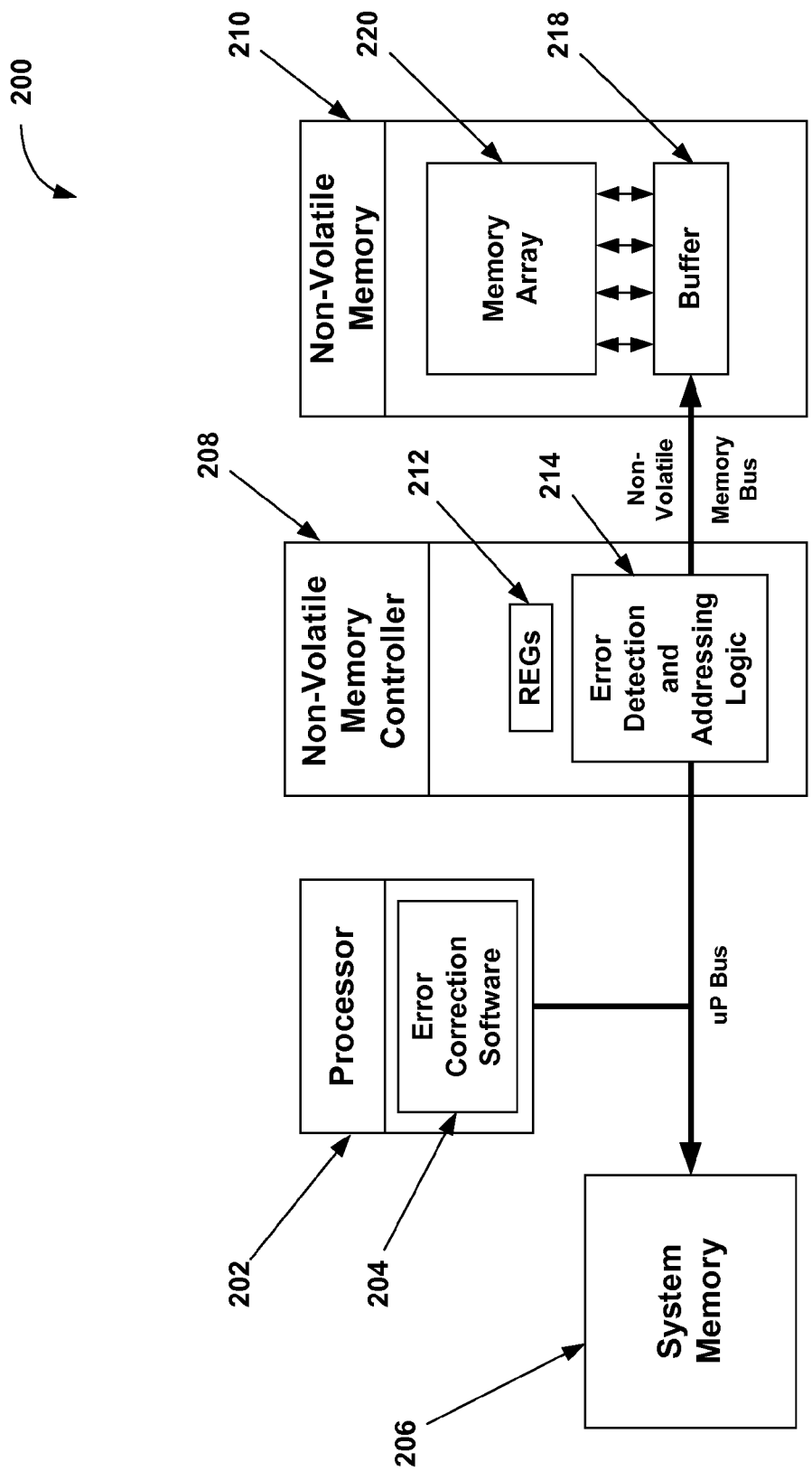
FIG. 2 is a diagram showing a system having configurable multi level error correction, in accordance with an embodiment of the present invention.

FIG. 1 was described in terms of the prior art. FIG. 2 is a diagram showing a system 200 having configurable multi level error correction, in accordance with an embodiment of the present invention. The system 200 includes a processor 202, executing error correction software 204, coupled to system memory 206. Also coupled to the processor 202 is a non-volatile memory controller 208, which is coupled to non-volatile memory 210. The non-volatile memory controller 208 includes a plurality of registers 212, and error detection and addressing logic 214. The non-volatile memory 210 includes a buffer 218 and a memory array 220.

During normal operation, the processor 202 utilizes the non-volatile memory controller 208 to read and write data to the non-volatile memory 210. When writing data to the non-volatile memory 210, the data generally is transferred from the system memory 206, though the non-volatile memory controller 208, and into the buffer 218. When passing through the non-volatile memory controller 208, the data passes through the error detection and addressing logic 214, which calculates a code (often called an error correction code or ECC data) that is appended to the data and stored along with the data in the buffer 218. The data then is transferred from the buffer 218 and stored into the non-volatile memory array 220. As mentioned previously, user data generally is stored in the main array of a page of memory, while the ECC data is stored in the spare area of the page.

When the data is later read from the non-volatile memory 210, the non-volatile memory controller 208 checks the data for errors using the error detection and addressing logic 214. Similar to above, when reading data from the non-volatile memory 210, the data is transferred from the memory array 220 to the buffer 218. The non-volatile memory controller 208 then reads the data from the buffer 218, passes the data through the error detection and addressing logic 214, and stores the data into the system memory 206.

Broadly speaking, while the data is being passed through the error detection and addressing logic 214, the error detection and addressing logic 214 calculates a new ECC code, which is compared to the ECC code that was stored with the data. If the new ECC code matches the stored ECC code, the data is error free. However, if the two ECC codes do not match, the error detection and addressing logic 214 calculates the addresses of the errors and the error correction software 204 executing on the processor 202 attempts to correct the defects in the data, which is now stored in the system memory 206. However, unlike conventional error detection hardware, embodiments of the present invention allow the level of error detection to be dynamically configured during operation of the system, as discussed next with respect to FIG. 3.

Figure 3:
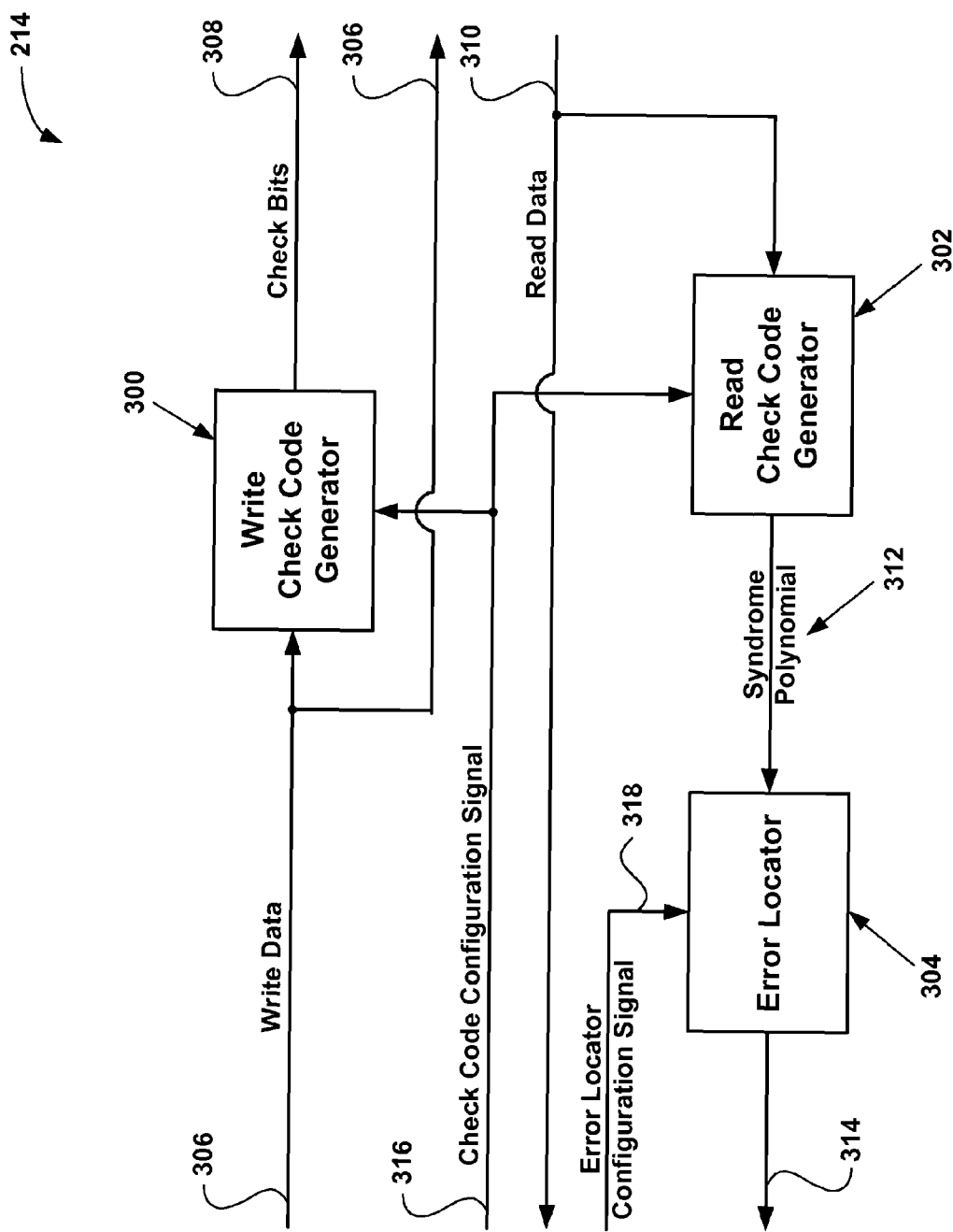
FIG. 3 is a block diagram showing dynamically configurable error detection and addressing logic, in accordance with an embodiment of the present invention.

FIG. 3 is a block diagram showing dynamically configurable error detection and addressing logic 214, in accordance with an embodiment of the present invention. The error detection and addressing logic 214 includes a write check code generator 300, a read check code generator 302, and an error locator 304. The write check code generator 300 is coupled to write data input 306 and a check bit output 308. The read check code generator 302 is coupled to a read data input 310 and a syndrome polynomial output 312, which is also coupled to the input of the error locator 304. In addition, the error locator 304 provides an error address output 314. As will be discussed in greater detail subsequently, both the write check code generator 302 and the read check code generator 304 are coupled to a check code configuration signal 316, while the error locator 304 is coupled to an error locator configuration signal 318.

In operation, data being written to the non-volatile memory is provided on the write data input 306, which provides the data to both the write check code generator 300 and the non-volatile memory buffer. The write check code generator 300 then generates an ECC code for the data, which is provided to the check bit output 308. As described above, the data is eventually stored in the main area of non-volatile memory, while the ECC code data generally is stored in the spare area of non-volatile memory. However, it should be noted that the embodiments of the present invention can be utilized with any configuration of user data and ECC code data storage, as need by each particular design.

When the data is later read from the non-volatile memory, the data is provided to system memory and the read check code generator 302 via the read data input 310. The read check code generator 302 also receives the stored ECC code previously stored with the data. The read check code generator 302 then generates an ECC code for the read data in manner similar to that described above with respect to the write check code generator 300. However, the read check code generator 302 also utilizes the previously stored ECC code and the newly generated ECC code to calculate a syndrome polynomial for the data. The syndrome polynomial is utilized for finding errors in the read data, and can be based on any error detection algorithm, such as Reed-Solomon codes or BCH codes. In general, the syndrome polynomial is zero when no errors are present in the read data, which generally occurs when the newly generated ECC code matches the ECC code previously stored with the read data. However, if the syndrome polynomial is a non-zero value, errors are present in the read data and the error locator 304 utilizes the syndrome polynomial to locate the addresses of the error or errors in the read data. For example, in one embodiment, the error locator 304 can utilize a Chien Search to calculate the roots of the syndrome polynomial and determine the addresses of the error or errors in the read data.

As mentioned previously, it can become necessary to change the level of error correction and detection in the system. To address this issue, embodiments of the present invention allow the level of error detection to be dynamically configured via the check code configuration signal 316. Similarly, the level of error correction is configured utilizing the error locator configuration signal 318. In this manner, the level of error detection and correction can be changed dynamically during system operation to accommodate changing hardware requirements. Moreover, the level of error detection and error correction can be set different from one another. Thus, an error detection guard band can be configured so as to be able to, for example, detect larger errors than can be corrected.

In one embodiment, the check code configuration signal 316 is utilized to configure the write check code generator 300 and the read check code generator 302 by indicating the number of bits having errors that can be detected. For example, in one embodiment, when the check code configuration signal 316 is set to a value of eight, the write check code generator 300 and the read check code generator 302 are configured to generate an ECC code capable of detecting errors in eight bits of data. Similarly, the error locator configuration signal 318 is utilized to configure the error locator 304 by indicating the number of bits that can addressed, and therefore corrected.

It should be noted that higher values of the check code configuration signal 316 will also result in more ECC code data being generated, and thus require more space for storage. Thus, the check code configuration signal 316 can be utilized to adjust the level of error detection in order to save storage space. For example, if a particular storage device does not have enough space for a particular level of error detection, the check code configuration signal 316 can given a lower value in order to reduce the size of the ECC code generated and thus save space in the memory.

Figure 4:
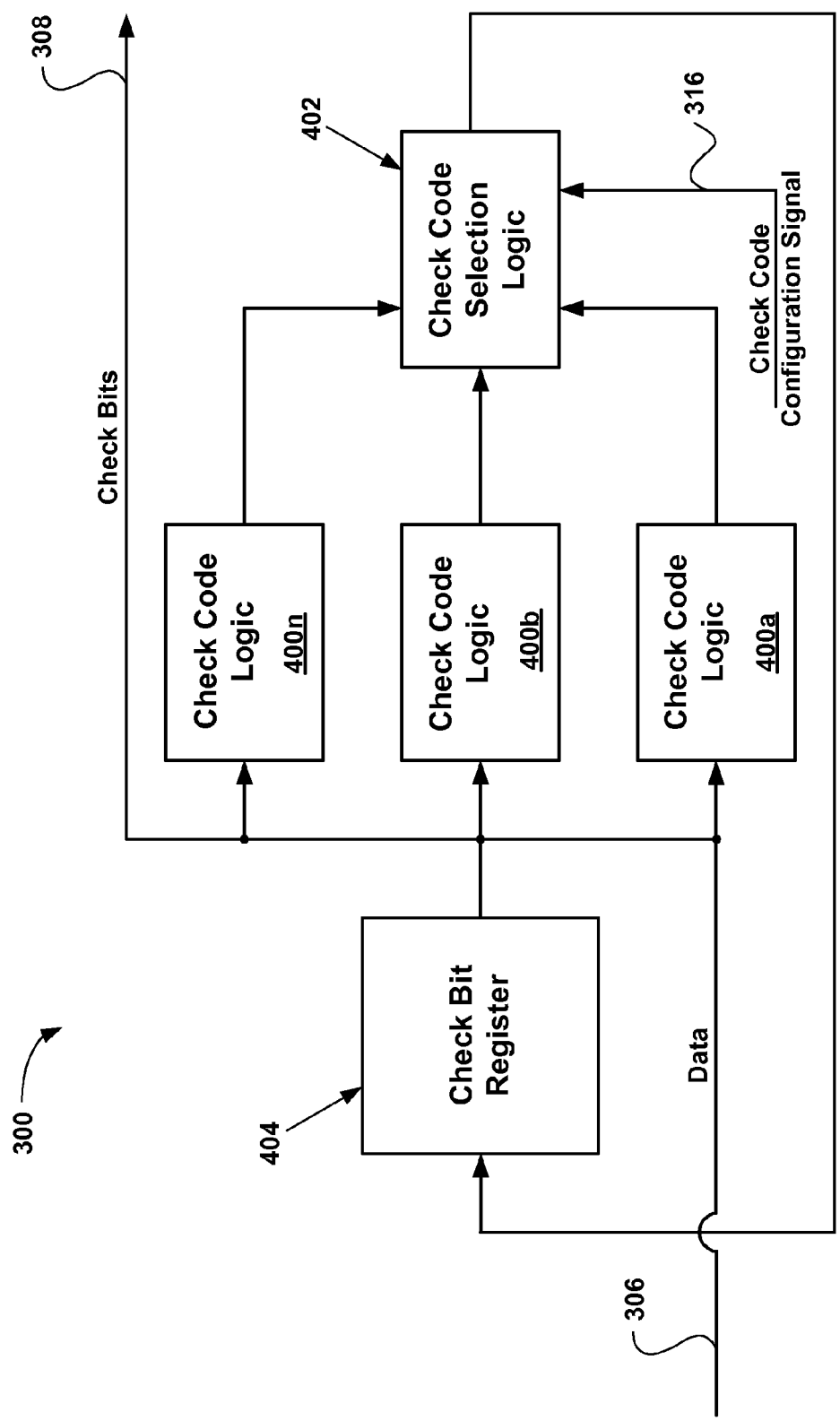
FIG. 4 is a block diagram showing an exemplary dynamically configurable check code generator having a check code configuration signal input, in accordance with an embodiment of the present invention.

FIG. 4 is a block diagram showing an exemplary dynamically configurable check code generator 300 having a check code configuration signal input 316, in accordance with an embodiment of the present invention. As illustrated in FIG. 4, the dynamically configurable check code generator 300 includes a plurality of check code logic modules 400a-400n, each coupled to a check code selection logic module 402. The check code selection logic module 402 is further coupled to a check bit register 404, which in turn is coupled to each of the check code logic modules 400a-400n.

Each check code logic module 400a-400n includes logic to produce a particular number check bits to provide a particular level of error detection. For example, in one embodiment, check code logic module 400a may be designed to produce ECC codes to detect four bits of error, check code logic module 400b may be designed to produce ECC codes to detect eight bits of error, and check code logic module 400n may be designed to produce ECC codes to detect sixteen bits of error. In this example, the sixteen bit check code logic module 400n can utilize, for example, all the check bit outputs 308 for the check code generator 300, the eight bit check code logic module 400b can utilize half the check bit outputs 308, and the four bit check code logic module 400a can utilize one quarter the check bit outputs 308. Although three separate check code logic modules 400a-400n are illustrated in FIG. 4 for exemplary purposes, it should be noted that any number of check code logic modules may be included in a check code generator 300 of the embodiments of the present invention as needed by particular system configuration requirements.

In operation, the check code selection logic 402 selects as input one of the check code logic modules 400a-400n based on the value of the check code configuration signal 316. In one embodiment, the check bits can be the flops that are present in the generator 300. In this embodiment, the check code selection logic 402, in essence, selects the algorithm of the flops by selecting which check code logic module 400a-400n to utilize in check bit generation. Hence, the output of the check code selection logic 402 is provided to the check bit register 404, which provides the re-circulating flops of the check code generator 300.

Referring back to FIG. 3, embodiments of the present invention utilize more or less of the hardware in the error locator 304 based on the value of the error locator configuration signal 318. For example, if the system was designed to detect sixteen bits of errors, then when the value of the error locator configuration signal 318 is sixteen, the error locator 304 will utilize all the hardware in the error locator 304. When the value of the error locator configuration signal 318 is eight, the error locator 304 will utilize half of the hardware in the error locator 304. When the value of the error locator configuration signal 318 is four, the error locator 304 will utilize one quarter of the hardware in the error locator 304. In general, the time required for the error locator 304 to process the syndrome polynomial 312 to determine error location addresses is substantially the same regardless of the level of error detection and correction utilized. For example, the time required for the error locator 304 to process the syndrome polynomial 312 when the error locator configuration signal 318 is sixteen is substantially the same as the time required to process the syndrome polynomial 312 when the error locator configuration signal 318 is eight.

Figure 5:
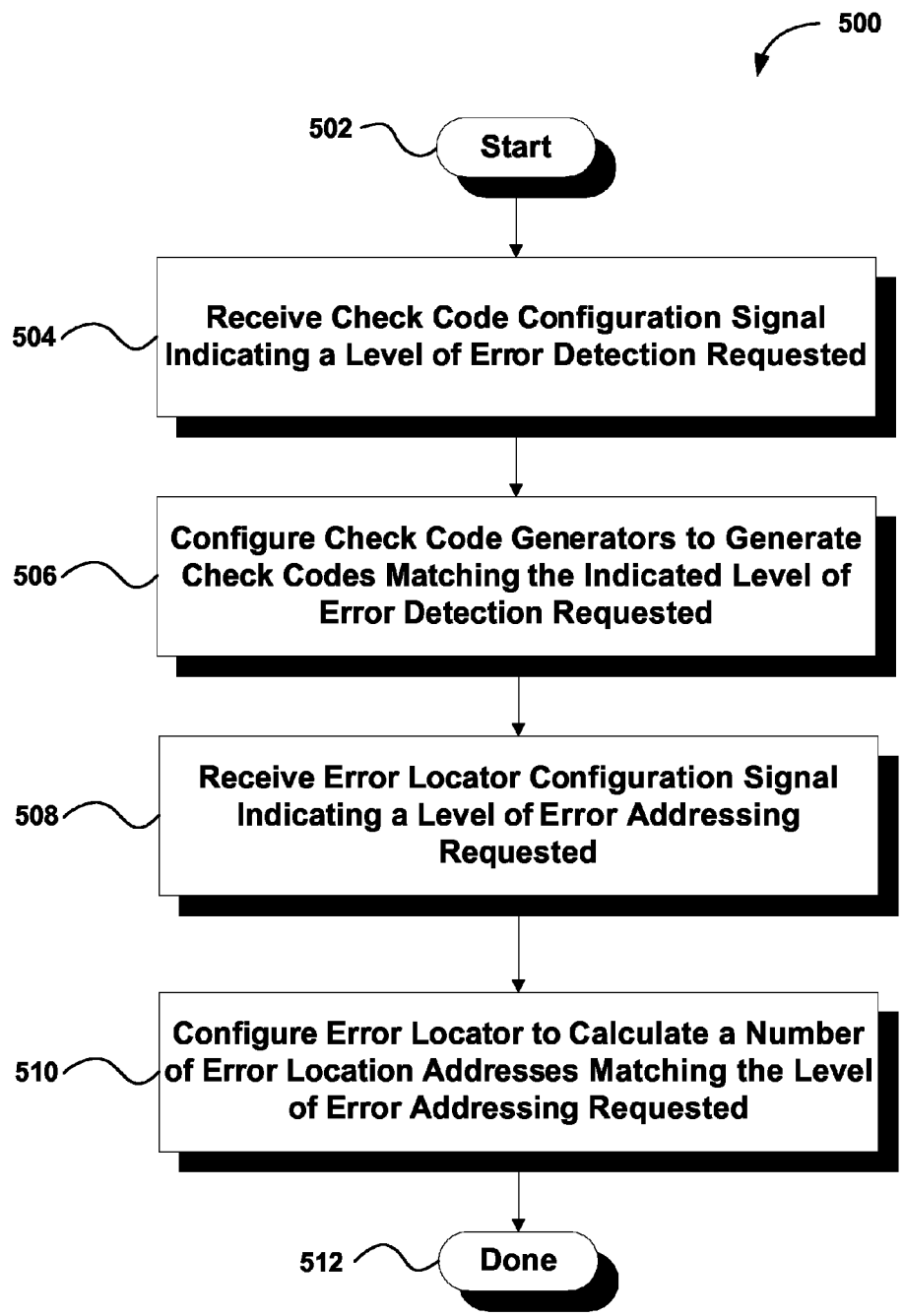
FIG. 5 is a flowchart showing a method for providing dynamically configurable multi level error correction, in accordance with an embodiment of the present invention.

FIG. 5 is a flowchart showing a method 500 for providing dynamically configurable multi level error correction, in accordance with an embodiment of the present invention. In an initial operation 502, preprocess operations are performed. Preprocess operations can include, for example, detecting the presence of new media, determining a level of error detection and correction required by a particular media, and other preprocess operations that will be apparent to those skilled in the art after a careful reading of the present disclosure.

In operation 504, a check code configuration signal indicating a level of error detection being requested is received. As mentioned previously, the amount of error detection encoded data (i.e., ECC data) generated by the check code generators is based on the value of the check code configuration signal. As will be apparent to those skilled in the art, greater levels of error detection generally require greater amounts of ECC data to be generated and stored along with the data. Thus, a balance generally is maintained between the level of error detection desired and the space and capabilities of the media being utilized. Thus, in operation 504, the check code configuration signal indicates the level of error and thus the amount of ECC data to be generated by the check code generators.

The check code generators then are configured to generate check codes matching the indicated level of error detection, in operation 506. As mentioned previously, the check code configuration signal indicates the number of bits having errors that should be detected using the write check code generator and the read check code generator. For example, in one embodiment, when the check code configuration signal is set to a value of eight, the write check code generator and the read check code generator are configured to generate an ECC code capable of detecting eight bits erroneous bits in a set of data. Similarly, the error locator configuration signal is utilized to configure the error locator 304 by indicating the number of bits that can be corrected. Since higher values of the check code configuration signal result in more ECC code data being generated, the check code configuration signal can be utilized to adjust the level of error detection in order to save storage space. In one embodiment, each check code generator includes a plurality of check code logic modules, each including logic to produce a particular number check bits to provide a particular level of error detection. In operation, check code selection logic selects as input one of the check code logic modules based on the value of the check code configuration signal.

In addition to the check code configuration signal, an error locator configuration signal that indicates a level of error addressing is received, in operation 508. The amount of error addressing the error locator will perform is based on the value error locator configuration signal. That is, the error locator configuration signal indicates the number of error location addresses the error locator will calculate. In this manner, the level of error detection and correction can be changed dynamically during system operation to accommodate changing hardware requirements. As mentioned previously, the level of error detection and error correction can be set different from one another. Thus, an error detection guard band can be configured so as to be able to, for example, detect larger errors than can be corrected.

In operation 510, the error locator is configured to calculate a number of error location addresses matching the level of error addressing requested. As discussed above, the amount of error addressing the error locator will perform is based on the value error locator configuration signal. Once configured, the error locator utilizes the syndrome polynomial generated by the read check code generator to calculate the addresses of errors in the read data, if any exist. In general, the syndrome polynomial is zero when no errors are present in the read data. However, if the syndrome polynomial is a non-zero value, errors are present in the read data and the error locator utilizes the syndrome polynomial to locate the addresses of the error or errors in the read data.

In one embodiment, as described above, the error locator is configured to utilize more or less of the hardware based on the value of the error locator configuration signal. For example, if the system was designed to detect sixteen bits of errors, then when the value of the error locator configuration signal is sixteen, the error locator utilizes all the hardware in the error locator. When the value eight, the error locator utilizes half of the hardware in the error locator, and when the value is four, the error locator utilizes one quarter of the hardware in the error locator. Thus, the error locator can be configured to utilize an amount of error locator hardware less than a total amount of error locator hardware available when the level of error addressing indicated by the error locator configuration signal is less than a maximum level of error addressing supported by the system. Advantageously, the time required for the error locator to process the syndrome polynomial to determine error location addresses generally is substantially the same regardless of the level of error detection and correction utilized.

Post process operations then are performed in operation 512, post process operations can include, for example, continued hardware configuration based on new media being introduced to the system, further ECC data calculation, and other post process operations that will be apparent to those skilled in the art after a careful reading of the present disclosure. In this manner, embodiments of the present invention advantageously allow the level of error detection and correction to be dynamically configured via signals to check code generation hardware and error location hardware. Thus, the level of error detection and correction can be changed dynamically during system operation to accommodate changing hardware requirements. Moreover, an error detection guard band can be configured so as to be able to, for example, detect larger errors than can be corrected by setting the level of error detection and error correction different from one another.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for providing dynamically configurable error correction, comprising:

receiving a first signal, wherein the first signal indicates a particular level of error detection that comprises a number of detectable bits in a set of data;

dynamically configuring a check code generator based on the received first signal to generate a variable amount of check codes capable of detecting errors in the set of data, wherein the check code generator includes a plurality of check code logic modules that each include logic to produce a particular number of check bits and logic for selecting a particular check code logic module output to provide the particular level of error detection;

receiving a second signal, wherein the second signal indicates a particular level of error addressing that comprises a number of calculable error location addresses associated with the number of detectable bits in the set of data, wherein the particular level of error addressing is variable with respect to the particular level of error detection; and dynamically configuring an error locator based on the received second signal to calculate error location addresses capable of locating errors in the set of data, wherein the error locator includes hardware designed to detect a maximum level of error addressing and a particular amount of the hardware is utilized based on the particular level of error addressing.

2. The method of claim 1, wherein the particular level of error detection includes a number of bits having errors that should be detected in data using a write check code generator and a read check code generator.

3. The method of claim 1, wherein the check code generator generates an amount of error correction code (ECC) data based on the particular level of error detection indicated by the first signal.

4. The method of claim 1, wherein the error locator calculates a number of roots to a syndrome polynomial based on the particular level of error addressing indicated by the second signal.

5. The method of claim 1, wherein the error locator is configured to utilize a particular amount of existing error locator hardware based on the particular level of error addressing indicated by the second signal.

6. The method of claim 1, further comprising:
configuring an error detection guard band to detect more errors that can be corrected by setting the particular level of error detection and the particular level of error addressing at different levels.

7. A non-volatile memory controller having dynamically configurable multi level error correction, comprising:

a first signal indicating a particular level of error detection that comprises a number of detectable bits in a set of data;

a check code generator coupled to the first signal, the check code generator being dynamically configured based on the first signal to generate a variable amount of error correction code (ECC) data capable of detecting errors in the set of data, wherein the check code generator includes a plurality of check code logic modules that each include logic to produce a particular number of check bits and logic for selecting a particular check code logic module output to provide the particular level of error detection;

a second signal indicating a particular level of error addressing that comprises a number of calculable error location addresses associated with the number of detectable bits in the set of data, wherein the particular level of error addressing is variable with respect to the particular level of error detection; and an error locator coupled to the second signal, the error locator being dynamically configured based on the second signal to calculate error location addresses capable of locating errors in the set of data, wherein the error locator includes hardware designed to detect a maximum level of error addressing and a particular amount of the hardware is utilized based on the particular level of error addressing.

8. The non-volatile memory controller of claim 7, wherein the check code generator is a read check code generator that calculates a syndrome polynomial based on read data received and the particular level of error detection indicated by the first signal.

9. The non-volatile memory controller of claim 8, wherein the second signal indicates a number of addresses of bits having errors in data that can be calculated by the error locator.

10. The non-volatile memory controller of claim 8, wherein the error locator calculates a number of roots to the syndrome polynomial based on the particular level of error addressing indicated by the second signal.

11. The non-volatile memory controller of claim 8, further comprising a write check code generator coupled to the check code configuration signal, the write check code generator being configured to generate an amount of ECC data based on the particular level of error detection indicated by the first signal.

12. The non-volatile memory controller of claim 7, wherein the first signal indicates a number of bits having errors that can be detected in data.

13. The non-volatile memory controller of claim 7, wherein the error locator is configured to utilize a particular amount of existing error locator hardware based on the particular level of error addressing indicated by the second signal.

14. The non-volatile memory controller of claim 13, further comprising:
an error detection guard band being configured to detect more errors that can be corrected by setting the particular level of error detection and the particular level of error addressing at different levels.

* * * * *